(12) United States Patent
Kitagawa

(10) Patent No.: US 11,743,973 B2
(45) Date of Patent: Aug. 29, 2023

(54) PLACING TABLE AND PLASMA PROCESSING APPARATUS

(71) Applicant: TOKYO ELECTRON LIMITED, Tokyo (JP)

(72) Inventor: Dai Kitagawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 246 days.

(21) Appl. No.: 17/085,591

(22) Filed: Oct. 30, 2020

(65) Prior Publication Data

US 2021/0051772 A1 Feb. 18, 2021

Related U.S. Application Data

(63) Continuation of application No. 14/730,520, filed on Jun. 4, 2015, now abandoned.

(30) Foreign Application Priority Data

Jun. 24, 2014 (JP) ................................ 2014-128852
Jan. 20, 2015 (JP) ................................ 2015-008447

(51) Int. Cl.
*H05B 3/26* (2006.01)
*H01L 21/683* (2006.01)
(Continued)

(52) U.S. Cl.
CPC .......... *H05B 3/26* (2013.01); *H01J 37/32532* (2013.01); *H01J 37/32642* (2013.01);
(Continued)

(58) Field of Classification Search
None
See application file for complete search history.

(56) References Cited

U.S. PATENT DOCUMENTS 5,846,375 A 12/1998 Gilchrist et al.
6,272,002 B1 8/2001 Mogi
(Continued)

FOREIGN PATENT DOCUMENTS

JP 2003-264223 A 9/2003
JP 2005-136350 A 5/2005
(Continued)

OTHER PUBLICATIONS

English Machine Translation of Miyata (JP-2008041627-A) retrieved from PE2E Search (Year: 2023).*
(Continued)

*Primary Examiner* — Ram N Kackar
*Assistant Examiner* — Laureen Chan
(74) *Attorney, Agent, or Firm* — WEIHROUCH IP

(57) ABSTRACT

Provided is a placing table configured to place a workpiece thereon. The placing table includes: an electrostatic chuck configured to attract the workpiece; a support member configured to support a focus ring; and a metal base having a first region configured to support the electrostatic chuck and a second region configured to support the support member, the second region surrounding the first region. The support member includes: an intermediate layer formed of a ceramic sintered compact and supported on the second region via an adhesive; a thermally sprayed ceramic layer formed on the intermediate layer by a thermal spraying method; and a heater electrode provided within the thermally sprayed ceramic layer. The heater electrode is formed by the thermal spraying method.

18 Claims, 4 Drawing Sheets

(51) Int. Cl.
  *H01L 21/67* (2006.01)
  *H01J 37/32* (2006.01)
  *H01L 21/687* (2006.01)

(52) U.S. Cl.
  CPC .. *H01J 37/32715* (2013.01); *H01J 37/32724* (2013.01); *H01L 21/67103* (2013.01); *H01L 21/67109* (2013.01); *H01L 21/6831* (2013.01); *H01L 21/68757* (2013.01); *H05B 3/262* (2013.01)

(56) References Cited

U.S. PATENT DOCUMENTS

| | | | |
|---|---|---|---|
| 2003/0164226 A1* | 9/2003 | Kanno | H01L 21/67109 438/758 |
| 2007/0283891 A1 | 12/2007 | Okayama | |
| 2008/0083723 A1* | 4/2008 | Tsukamoto | H01L 21/67103 219/385 |
| 2008/0236749 A1 | 10/2008 | Koshimizu et al. | |
| 2009/0173448 A1* | 7/2009 | Fujii | H01L 21/6833 156/379.6 |
| 2009/0178764 A1 | 7/2009 | Kanno et al. | |
| 2010/0326957 A1* | 12/2010 | Maeda | H01J 37/20 156/345.26 |
| 2012/0281334 A1 | 11/2012 | Sasaki et al. | |
| 2012/0299253 A1* | 11/2012 | Kosakai | H01L 21/6831 279/128 |
| 2013/0220545 A1 | 8/2013 | Koizumi et al. | |
| 2013/0277339 A1* | 10/2013 | Willwerth | H01J 37/32724 219/121.43 |
| 2014/0011153 A1 | 1/2014 | Lindley | |
| 2014/0069585 A1* | 3/2014 | Aoto | H01J 37/32807 156/345.52 |
| 2015/0116889 A1* | 4/2015 | Yamasaki | H02N 13/00 427/446 |

FOREIGN PATENT DOCUMENTS

| | | | |
|---|---|---|---|
| JP | 2007-258500 A | | 10/2007 |
| JP | 2008041627 A | * | 2/2008 |
| JP | 3155802 U | | 12/2009 |
| JP | 2010-157559 A | | 7/2010 |
| JP | 2013-175573 A | | 9/2013 |
| JP | 2014-072355 A | | 4/2014 |
| JP | 2014-078731 A | | 5/2014 |

OTHER PUBLICATIONS

Maeda et al. JP-2007258500-A English Machine Translation retrieved from ESPACEN ET Jun. 16, 2019 (Year: 2019).

JP2014072355 Miwa English Machine Translation retrieved from ESPACENET Apr. 13, 2018 (Year: 2014).

J P3155802U Takebayashi et al. English Machine Translation retrieved from ESPACEN ET Apr. 13, 2018 (Year: 2009).

Bralla, James G. ((2007). Handbook of Manufacturing Processes—How Products, Components and Materials are Made—Wire Forms. Industrial Press.

\* cited by examiner

PLACING TABLE AND PLASMA PROCESSING APPARATUS

CROSS-REFERENCE TO RELATED APPLICATIONS

This application is a Continuation of U.S. patent application Ser. No. 14/730,520, filed on Jun. 4, 2015, which claims priority from Japanese Patent Application Nos. 2014-128852 and 2015-008447, filed on Jun. 24, 2014 and Jan. 20, 2015, respectively, with the Japan Patent Office, all of which are incorporated herein in their entireties by reference.

TECHNICAL FIELD

Exemplary embodiments of the present disclosure relate to a placing table and a plasma processing apparatus.

BACKGROUND

In a fine processing of a workpiece (e.g., a semiconductor wafer or a glass substrate) using a plasma processing apparatus, a temperature control of the workpiece is important. When the temperature control of the workpiece is not appropriately performed, the reaction uniformity of a workpiece surface cannot be assured, which causes deterioration in the in-plane uniformity in the processing of the workpiece. Therefore, a plasma processing apparatus in which a placing table has a temperature control function of a workpiece is used (see, e.g., Japanese Patent Laid-Open Publication No. 2013-175573).

In the plasma processing apparatus disclosed in Japanese Patent Laid-Open Publication No. 2013-175573, a placing table on which a workpiece is disposed is installed in the lower region of a processing container. The placing table includes an RF plate configured to apply a high frequency power, a cooling plate disposed on the RF plate and formed with a flow path for circulation of a coolant, and a ceramic plate disposed on the cooling plate to provide a placing surface for the workpiece. The ceramic plate includes temperature control heater electrodes that heat a central region and a peripheral edge region of the ceramic plate, respectively. The ceramic plate is attached to the top surface of the cooling plate using an adhesive. The temperature control heater electrodes are connected with a power feeding mechanism that extends through through-holes formed in the RF plate and the cooling plate. The power feeding mechanism supplies a power to a temperature control heater so as to heat the temperature control heater electrodes. In addition, a focus ring is installed on the peripheral edge region of the ceramic plate to surround the outer circumference of the workpiece.

SUMMARY

In an aspect, there is provided a placing table configured to place a workpiece thereon. The placing table includes: an electrostatic chuck configured to attract the workpiece; a support member configured to support a focus ring; and a metal base having a first region configured to support the electrostatic chuck and a second region configured to support the support member in which the second region surrounds the first region. The support member includes: an intermediate layer formed of a ceramic sintered compact and supported on the second region via an adhesive; a thermally sprayed ceramic layer formed on the intermediate layer by a thermal spraying method; and a heater electrode provided within the thermally sprayed ceramic layer. The heater electrode is formed by the thermal spraying method.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
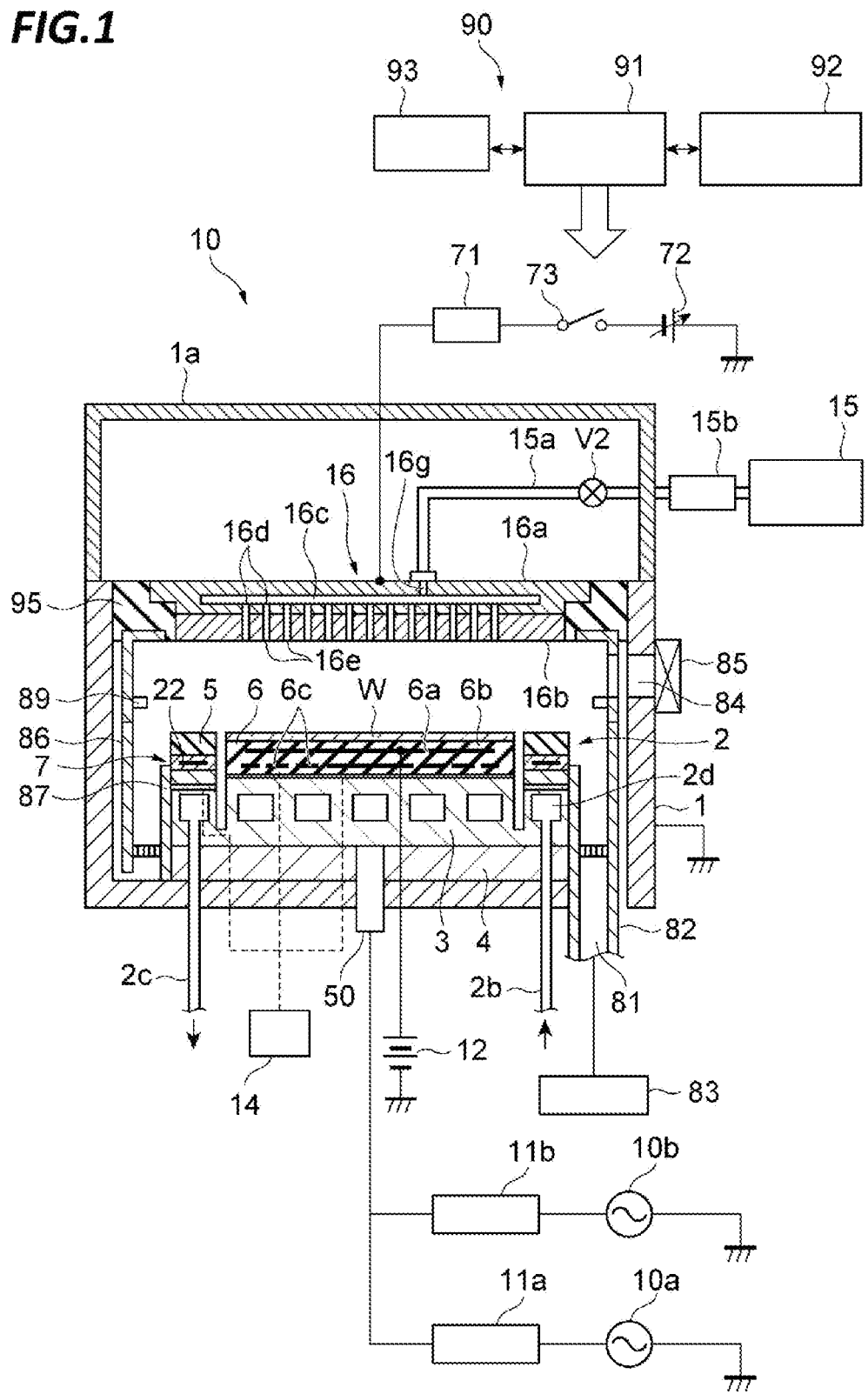
FIG. 1 is a schematic cross-sectional view illustrating a configuration of a plasma processing apparatus according to one exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

To realize the uniformity of in-plane processing accuracy of a workpiece, it may occasionally be required to control not only the temperature of the workpiece, but also the temperature of the focus ring. For example, for the purpose of improving a processing performance, it is requested that the temperature of the focus ring be set to be in a temperature band higher than a set temperature of the workpiece. For example, it is requested that a temperature difference of 100° C. or more be provided between the set temperature of the focus ring and the set temperature of the workpiece.

In order to provide a difference between the set temperature of the workpiece and the set temperature of the focus ring, it is considered that a second support member for the focus ring is provided separately from a first support member for the workpiece and an independent heater electrode is provided to the second support member. However, in a case where the second support member for the focus ring is attached to the cooling plate via an adhesive, the second support member may be detached as the adhesive force of the adhesive deteriorates when the calorific value of the heater electrodes increases so that the temperature of the adhesive exceeds the heat resistance temperature of the adhesive. Thus, in the placing table as described above, it is required to limit the calorific values emission of the heater electrodes to prevent the temperature of the adhesive from exceeding the heat resistance temperature. As a result, it is difficult to increase the difference between the set temperature of the workpiece and the set temperature of the focus ring.

Accordingly, what are requested in the technical field are a placing table and a plasma processing apparatus that are capable of increasing the difference between the set temperature of a workpiece and the set temperature of a focus ring.

In an aspect, there is provided a placing table configured to place a workpiece thereon. The placing table includes: an electrostatic chuck configured to attract the workpiece; a support member configured to support a focus ring; and a metal base having a first region configured to support the electrostatic chuck and a second region configured to support the support member, the second region surrounding the first region. The support member includes: an intermediate layer formed of a ceramic sintered compact and supported on the second region via an adhesive; a thermally sprayed ceramic layer formed on the intermediate layer by a thermal spraying method; and a heater electrode provided within the thermally sprayed ceramic layer. The heater electrode is formed by the thermal spraying method.

The placing table includes a support member to support a focus ring. The support member includes an intermediate layer that is formed of a ceramic sintered compact and interposed between a heater electrode and a second region of a base. The intermediate layer is capable of increasing a temperature gradient between the heater electrode and the base because it increases a heat resistance between the heater electrode and the second region of the base. Thus, the temperature rise of an adhesive due to the heater electrode may be suppressed. As a result, the temperature of the focus ring may be set to be high because the limitation on the calorific value of the heater electrode due to the heat resistance temperature of the adhesive is relieved. In addition, when the heat resistance between the heater electrode and the second region of the base increases, heat fluxes from the heater electrode to the base decreases and heat fluxes from the heater electrode to the focus ring increase. Therefore, the focus ring may be efficiently heated. According to the placing table, it is possible to increase the difference between the set temperatures of a workpiece and the focus ring.

In one exemplary embodiment, the first region and the second region may be divided by a groove that extends in an annular shape between the first region and the second region. In the present exemplary embodiment, the movement of heat between the first region and the second region is suppressed since the first region and the second region are physically divided by the groove. Thus, the heat generated in the heater electrode may be used for heating the focus ring without being pushed out to the first region of the base. As a result, the temperature of the focus ring may be set to be high. Accordingly, it is possible to increase the difference between the set temperatures of the workpiece and the focus ring.

In one exemplary embodiment, a power feeding contact electrically connected to the heater electrode is provided in the intermediate layer, and the power feeding contact is formed of a conductive ceramic material. In a plasma processing, the support member supporting the focus ring undergoes a great temperature variation. Therefore, in a case where a power is fed to the heater electrode using a metal junction, a junction defect may occur due to deformation such as thermal expansion or thermal contraction of a metal. Whereas, in the present exemplary embodiment, a power feeding contact is provided in the intermediate layer. The power feeding contact may be formed of a conductive ceramic material, thereby reducing a thermal expansion difference between the intermediate layer that is in contact with the contact and a thermally sprayed ceramic layer. In this way, it is possible to suppress the generation of the junction defect due to thermal stress deformation.

In one exemplary embodiment, the thermally sprayed ceramic layer may include a zirconia film formed between the heater electrode and the intermediate layer by the thermal spraying method. Since zirconia is a ceramic material having a low thermal conductivity, the temperature gradient between the heater electrode and the base may be further increased by interposing the zirconia film between the heater electrode and the intermediate layer. As a result, it is possible to increase the difference between the set temperatures of the workpiece and the focus ring.

A plasma processing apparatus according to another aspect of the present disclosure includes the placing table as described above.

According to the aspect and exemplary embodiments of the present disclosure, it is possible to increase a difference between the set temperature of a workpiece and the set temperature of a focus ring.

Hereinafter, various exemplary embodiments will be described in detail with reference to the accompanying drawings. In addition, the same or corresponding parts throughout the respective drawings are designated by the same reference numerals. In addition, in the present specification, terms "upper" and "lower" are based on illustrated states and used for convenience.

FIG. 1 is a schematic sectional view illustrating a configuration of a plasma processing apparatus according to one exemplary embodiment. The plasma processing apparatus includes a processing container 1 configured to be hermetically sealed. The processing container has an electrical ground potential. The processing container 1 has a cylindrical shape and is formed of, for example, aluminum. The processing container 1 defines a processing space in which plasma is generated. A placing table 2 configured to horizontally support a semiconductor wafer W (hereinafter briefly referred to as "wafer") as a workpiece is accommodated in the processing container 1. On an exemplary embodiment, the placing table 2 includes a base 3, an electrostatic chuck 6, and a support member 7. The base 3 has an approximately cylindrical shape and is formed of a conductive metal such as, for example, aluminum. The base 3 functions as a lower electrode. The base 3 is supported by a support stand 4 of an insulating material, and the support stand 4 is installed on the bottom of the processing container 1. For example, the base 3 is fastened to the support stand 4 from the rear surface thereof via screws. The electrostatic chuck 6 is installed at the center of the placing table 2 when viewed in a plan view and has a function for electrostatically attracting the wafer W.

The electrostatic chuck 6 has an electrode 6a and an insulator 6b. The electrode 6a is provided within the insulator 6b and a direct current (DC) power source 12 is connected to the electrode 6a. The electrostatic chuck 6 is configured to attract the wafer W by a Coulomb force as a DC voltage is applied to the electrode 6a from the DC power source 12. One or more heaters 6c serving as heating elements are provided in the electrostatic chuck 6. The heaters 6c are connected to a heater power source 14. For example, the heaters 6c extend in an annular shape to surround the center of the placing table 2. The heaters 6c may include, for example, a heater that heats a central region and a heater that extends in an annular shape to surround the outside of the central region. In this case, the temperature of the wafer W may be controlled for each of a plurality of regions located in a radial direction about the center of the wafer W.

In addition, an annular focus ring 5 is installed outside the electrostatic chuck 6. The focus ring 5 is formed of, for example, single crystalline silicon and supported on the base 3 via the support member 7. A heater electrode 22 serving as a heating element is installed within the support member 7.

The heater electrode 22 controls the temperature of the focus ring 5. The heater electrode 22 is connected to the heater power source 14 via a power feeding mechanism to be described below. As such, the temperature of the wafer W and the temperature of the focus ring 5 are independently controlled by different heaters.

A power feeding rod 50 is connected to the base 3. A first RF power source 10a is connected to the power feeding rod 50 via a first matcher 11a and, in addition, a second RF power source 10b is connected to the power feeding rod 50 via a second matcher 11b. The first RF power source 10a is a power source for plasma generation and is configured to supply a high frequency power having a predetermined frequency to the base 3 of the placing table 2. In addition, the second RF power source 10b is an ion drawing-in (bias) power source and is configured to supply a high frequency power, having a predetermined frequency lower than that of the first RF power source 10a, to the base 3 of the placing table 2.

A coolant flow path 2d is formed within the base 3 and a coolant inlet pipe 2b and a coolant outlet pipe 2c are connected to the coolant flow path 2d. In addition, the placing table 2 is configured to be controllable to a predetermined temperature by circulating a coolant such as, for example, cooling water, through the coolant flow path 2d. In addition, a gas supply pipe may be provided to penetrate, for example, the placing table 2 so as to supply a cool heat transfer gas (backside gas) such as, for example, helium gas, to the rear surface of the wafer W. The gas supply pipe is connected to a gas supply source. With this configuration, the wafer W attracted to and held on the top surface of the placing table 2 by the electrostatic chuck 6 is controlled to a predetermined temperature.

Meanwhile, a shower head 16 functioning as an upper electrode is provided above the placing table 2 to face, in parallel, the placing table 2. The shower head 16 and the placing table 2 function as a pair of electrodes (the upper electrode and the lower electrode).

The shower head 16 is provided in a ceiling wall portion of the processing container 1. The shower head 16 includes a main body 16a and a top plate 16b forming an electrode plate, and is supported on the top of the processing container 1 via an insulating member 95. The main body 16a is formed of a conductive material, for example, anodized aluminum, and configured to removably support the top plate 16b therebelow.

A gas diffusion chamber 16c is provided within the main body 16a and a plurality of gas passage holes 16d is formed in the bottom of the main body 16a to be located below the gas diffusion chamber 16c. In addition, the top plate 16b is formed with gas introduction holes 16e such that the gas introduction holes 16e penetrate the top plate 16b in the thickness direction and overlap the gas passage holes 16d. With this configuration, a processing gas supplied to the gas diffusion chamber 16c is distributed and supplied in a shower form to the interior of the processing container 1 through the gas passage holes 16d and the gas introduction holes 16e.

The main body 16a is formed with a gas introduction port 16g configured to introduce the processing gas to the gas diffusion chamber 16c. A gas supply pipe 15a is connected to the gas introduction port 16g and a processing gas supply source 15 that supplies the processing gas is connected to the other end of the gas supply pipe 15a. A mass flow controller (MFC) 15b and an opening/closing valve V2 are provided in the gas supply pipe 15a in this order from the upstream side. As such, the processing gas for plasma etching is supplied from the processing gas supply source 15 to the gas diffusion chamber 16c through the gas supply pipe 15a, and then distributed and supplied in a shower form from the gas diffusion chamber 16c to the interior of the processing container 1 through the gas passage holes 16d and the gas introduction holes 16e.

A variable DC power source 72 is electrically connected to the shower head 16 serving as the upper electrode, via a low pass filter (LPF) 71. The variable DC power source 72 enables ON/OFF of power feeding by an ON/OFF switch 73. The current/voltage of the variable DC power source 72 and the ON/OFF of the ON/OFF switch 73 are controlled by a controller 90 to be described below. When plasma is generated in the processing space as high frequency waves are applied to the placing table 2 from the second RF power source 10b, the ON/OFF switch 73 is turned ON by the controller 90 as needed so that a predetermined DC voltage is applied to the shower head 16 serving as the upper electrode.

In addition, a cylindrical ground conductor 1a is installed to extend upward from the sidewall of the processing container 1 to a position higher than the height of the shower head 16. The cylindrical ground conductor 1a has a ceiling wall at the top thereof.

An exhaust port 81 is formed in the bottom portion of the processing container 1. A first exhaust device 83 is connected to the exhaust port 81 through an exhaust pipe 82. The first exhaust device 83 includes a vacuum pump and is configured to decompress the interior of the processing container 1 to a predetermined vacuum by operating the vacuum pump. Meanwhile, the sidewall of the processing container 1 is formed with a carry-in/carry-out port 84 for the wafer W and a gate valve 85 is installed to the carry-in/carry-out port 84 to open/close the carry-in/carry-out port.

At the inner side portion of the processing container, a deposition shield 86 is provided along the inner wall surface. The deposition shield 86 prevents by-products (deposits) of the etching from being attached to the processing container 1. A conductive member (GND block) 89, which is connected to a ground to enable control of a ground potential, is provided on the deposition shield 86 at approximately the same height as the wafer W, which prevents abnormal discharge. In addition, a deposition shield 87 is installed to the lower end of the deposition shield 86 to extend along the placing table 2. The deposition shields 86 and 87 are separable from each other.

The operation of the plasma processing apparatus configured as described above is totally controlled by the controller 90. The controller 90 is provided with a process controller 91 that includes a CPU and controls the respective components of the plasma processing apparatus, a user interface 92, and a storage unit 93.

The user interface 92 is configured as, for example, a keyboard, on which a process manager performs an input operation of a command for managing the plasma processing apparatus, or a display that visualizes and displays an operating state of the plasma processing apparatus.

The storage unit 93 stores recipes in which, for example, control programs (software) or processing condition data for implementing various processings in the plasma processing apparatus under the control of the process controller 91 are stored. In addition, as any recipe is called from the storage unit 93 by, for example, an instruction from the user interface 92 and executed by the process controller 91 as needed, a desired processing may be performed in the plasma processing apparatus under the control of the process controller 91. In addition, the recipes such as, for example, control programs or processing condition data may be used in a state where they are stored in a computer readable recording medium (e.g., a hard disk, a CD, a flexible disk, or a semiconductor memory), or may be used online, for example, by causing them to be frequently transmitted from other devices through a dedicated line.

Figure 2:
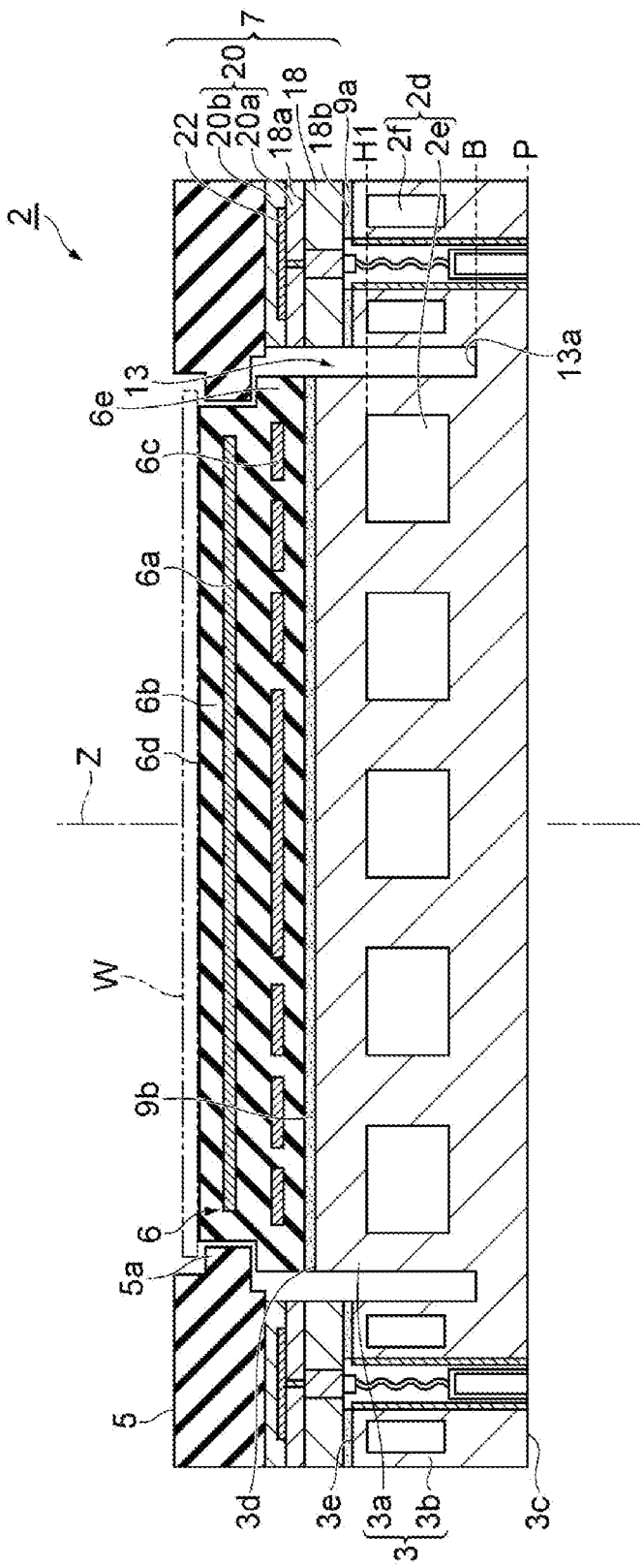
FIG. 2 is a schematic cross-sectional view illustrating a placing table in the plasma processing apparatus of FIG. 1.

Next, a configuration of main components of the placing table 2 will be described with reference to FIG. 2. FIG. 2 is a schematic sectional view illustrating the placing table 2 in the plasma processing apparatus of FIG. 1.

The base 3 exhibits, for example, an approximately cylindrical shape and has a rear surface 3*c* and a front surface side (a top surface 3*d* and a top surface 3*e*) opposite to the rear surface 3*c*. The front surface side of the base 3 is formed with an annular groove 13 to surround the axis Z of the base 3. That is, the groove 13 is formed in an annular shape when viewed in the direction perpendicular to the surface of the base 3. In addition, the groove 13 may be formed either in a continuous annular shape or in a discrete annular shape. The top of the base 3 is divided, by the groove 13, into a circular base central portion (first region) 3*a* when viewed in the direction perpendicular to the surface of the base 3 and an annular base peripheral edge portion (second region) 3*b* when viewed in the direction perpendicular to the surface of the base 3. The axis of the base central portion 3*a* having a cylindrical shape coincides with the axis Z of the base 3. In addition, the base peripheral edge portion 3*b* is formed to surround the axis Z of the base 3, i.e. the axis of the base central portion 3*a*. The base central portion 3*a* has the circular top surface 3*d* to support the electrostatic chuck 6. The base peripheral edge portion 3*b* has the annular top surface 3*e* to support the focus ring 5. As such, the surface of the base 3 is divided into the circular top surface 3*d* and the annular top surface 3*e* by the groove 13.

The heights of the top surface 3*d* and the top surface 3*e* are appropriately adjusted according to the thickness of the wafer W, the thickness of the focus ring 5, the thickness or physical properties of a material interposed between the wafer W and the base central portion 3*a*, and the thickness or physical properties of a material interposed between the focus ring 5 and the base peripheral edge portion 3*b* so that the heat transfer or the RF power for the wafer W coincides with the heat transfer or the RF power for the focus ring 5. That is, although the drawing exemplifies a case where the heights of the top surface 3*d* and the top surface 3*e* do not coincide with each other, the heights may coincide with each other.

The coolant flow path 2*d* formed within the base 3 includes an inner coolant flow path 2*e* located in the inner portion of the base 3 inside the groove 13 and an outer coolant flow path 2*f* located in the outer edge portion of the base 3 outside the groove 13. The inner coolant flow path 2*e* is formed below the top surface 3*d* of the base central portion 3*a*. The outer coolant flow path 2*f* is formed below the top surface 3*e* of the base peripheral edge portion 3*b*. That is, the inner coolant flow path 2*e* is located below the wafer W and functions to absorb heat of the wafer W, and the outer coolant flow path 2*f* is located below the focus ring 5 and functions to absorb heat of the focus ring 5. In addition, the inner coolant flow path 2*e* and the outer coolant flow path 2*f* may be connected to different cooling mechanisms such that coolants of different temperatures may circulate therethrough.

The groove 13 has a bottom surface 13*a* within the base 3. That is, the base central portion 3*a* and the base peripheral edge portion 3*b* are connected to each other below the groove 13. With reference to a height position P of the rear surface 3*c* of the base 3, a height position B of the bottom surface 13*a* is at the same position as the height of the uppermost end surface among the upper end surfaces of the coolant flow paths 2*e* and 2*f*, or lower than the height of the uppermost end surface among the upper end surfaces of the coolant flow paths 2*e* and 2*f* FIG. 2 illustrates a case where the upper end surfaces of the coolant flow paths 2*e* and 2*f* have the same height H1. Therefore, the height position B of the bottom surface 13*a* of the groove 13 needs to be equal to or lower than the height H1. In this way, when the groove 13 is formed at least up to the upper end surfaces of the coolant flow paths 2*e* and 2*f*, heat fluxes in the horizontal direction within the base 3 may be interrupted by providing a space above the coolant flow paths 2*e* and 2*f* to cut physical continuity. The space becomes a vacuum space during a plasma processing, which enables vacuum insulation.

The base central portion 3*a* of the base 3 supports the electrostatic chuck 6 on the top surface 3*d* thereof. The electrostatic chuck 6 is installed on the top surface 3*d* via an adhesive 9*b*. The electrostatic chuck 6 has a disc shape and is installed to be coaxial to the axis Z of the base 3. A placing surface 6*d* for mounting of the wafer W is formed on the upper end of the electrostatic chuck 6. The placing surface 6*d* has a circular shape, and comes into contact with the rear surface of the wafer W to support the disc-shaped wafer W. In addition, a flange 6*e* protruding outwardly in the radial direction of the electrostatic chuck 6 is formed on the lower end of the electrostatic chuck 6. That is, the electrostatic chuck 6 has different outer diameters depending on the positions of the side surface. In addition, the electrostatic chuck 6 is configured by interposing an electrode 6*a* and heaters 6*c* between insulators 6*b*. In the drawing, the heaters 6*c* are located below the electrode 6*a*. The placing surface 6*d* is heated by the heaters 6*c* in a controlled manner. In addition, the heaters 6*c* may not be present within the electrostatic chuck 6. For example, the heaters 6*c* may be attached to the rear surface of the electrostatic chuck 6 by the adhesive 9*b* and may be interposed between the placing surface 6*d* and the coolant flow path 2*e*.

The focus ring 5 is supported by the base peripheral edge portion 3*b* via the support member 7. The focus ring 5 is a circular annular member and installed to be coaxial to the axis Z of the base 3. A convex portion 5*a* is formed on the inner side portion of the focus ring 5 to protrude inwardly in the diametric direction. That is, the focus ring 5 has different inner diameters depending on the positions of the inner side surface. For example, the inner diameter of a location where the convex portion 5*a* is not formed is larger than the outer diameter of the wafer W and the outer diameter of the flange 6*e* of the electrostatic chuck 6. Meanwhile, the inner diameter of a location where the convex portion 5*a* is formed is smaller than the outer diameter of the flange 6*e* of the electrostatic chuck 6 and larger than the outer diameter of a location where the flange 6*e* of the electrostatic chuck 6 is not formed.

The focus ring 5 is mounted on the top surface of the support member 7 such that the convex portion 5*a* is spaced apart from the top surface of the flange 6*e* of the electrostatic chuck 6 and also spaced apart from the side surface of the electrostatic chuck 6. That is, gaps are formed between the lower surface of the convex portion 5*a* of the focus ring 5 and the top surface of the flange 6*e* of the electrostatic chuck 6 and between the side surface of the convex portion 5*a* of the focus ring 5 and the side surface of the electrostatic chuck 6 formed with no flange 6*e*. In addition, the convex portion 5*a* of the focus ring 5 is located above the groove 13. That is, the convex portion 5*a* is present at a position where it overlaps the groove 13 to cover the groove 13 when viewed in the direction perpendicular to the placing surface 6d. In this way, it is possible to prevent plasma from entering the groove 13.

The base peripheral edge portion 3b of the base 3 supports the focus ring 5 on the top surface 3e thereof via the support member 7. The support member 7 includes an intermediate layer 18, a thermally sprayed ceramic layer 20, and the heater electrode 22. The intermediate layer 18 is an annular member formed to be coaxial to the axis Z of the base 3 and has a top surface 18a and a bottom surface 18b. The intermediate layer 18 is formed of, for example, a ceramic sintered compact acquired by a pressure molding. In one example, the intermediate layer 18 is formed of an alumina ($Al_2O_3$) ceramic sintered compact. In addition, a constituent material of the intermediate layer 18 is not limited to the alumina ceramic sintered compact so long as it is a ceramic sintered compact having high brittleness. For example, the intermediate layer 18 may be a sintered compact including at least one material of alumina, yttrium oxide ($Y_2O_3$), silicon carbide (SiC), aluminum nitride (AlN), and silicon nitride ($Si_3N_4$).

The bottom surface 18b of the intermediate layer 18 is attached to the top surface 3e of the base peripheral edge portion 3b via an adhesive 9a. The adhesive 9a is, for example, a silicon-based, epoxy-based, or acryl-based adhesive. The adhesive 9a has, for example, a heat resistance in a range of 0.1 W/mK to 0.5 W/mK and a heat resistance temperature in a range of 80° C. to 150° C. The adhesive 9a also functions as a stress deformation absorption layer while increasing heat resistance between the intermediate layer 18 and the base peripheral edge portion 3b. In addition, the thicknesses of the intermediate layer 18 and the adhesive 9a may be appropriately set according to the required performance of the base 3. For example, in a case where the intermediate layer 18 is formed of an alumina ceramic sintered compact, the thickness of the intermediate layer 18 may be set to be in a range of 1 mm to 8 mm. In addition, in a case where the adhesive 9a is a silicon-based adhesive, the thickness of the adhesive 9a may be set to be in a range of 0.07 mm of 1.8 mm.

The thermally sprayed ceramic layer 20 is a ceramic layer formed on the top surface 18a of the intermediate layer 18 by a thermal spraying method, and exhibits an annular shape coaxial to the intermediate layer 18. The focus ring 5 is disposed on the thermally sprayed ceramic layer 20. The thermally sprayed ceramic layer 20 may include a first film 20a and a second film 20b. Both the first film 20a and the second film 20b are ceramic films formed by the thermal spraying method. The thermal spraying method refers to a method for forming a film according to a thermal spray material by spraying a particulate thermal spray material to the surface of a substrate.

The first film 20a is, for example, a thermally sprayed zirconia film formed by spraying zirconia (ZrO2) particles to the top surface 18a of the intermediate layer 18. The second film 20b is, for example, a thermally sprayed yttrium oxide (Y2O3) film by spraying yttrium oxide (Y2O3) particles to the first film 20a. As the thermally sprayed ceramic layer 20 is formed on the top surface 18a of the intermediate layer 18 by a thermal spraying method, the thermally sprayed ceramic layer 20 comes into close contact with the top surface 18a of the intermediate layer 18 to be integrated with the intermediate layer 18. In addition, the first film 20a and the second film 20b do not necessarily have to be formed of different materials and may be formed of the same material.

Constituent materials of the first film 20a and the second film 20b are not limited so long as they have a thermal conductivity lower than that of the constituent material of the intermediate layer 18 and a thermal expansion close to that of the constituent material of the intermediate layer 18. For example, the first film 20a may be a thermally sprayed film including at least one of alumina, yttrium oxide, zirconia, and silicon carbide. Likewise, the second film 20b is a thermally sprayed film including at least one of alumina, yttrium oxide, zirconia, and silicon carbide. Thicknesses of the first film 20a and the second film 20b may be appropriately set according to the required performance of the base 3. For example, in the case where the first film 20a is a thermally sprayed zirconia film, the thickness of the first film 20a may be set to be in a range of 0.05 mm to 3 mm. In addition, in the case where the second film 20b is a thermally sprayed yttrium oxide film, the thickness of the second film 20b may be set to be in a range of 0.05 mm to 3 mm. In addition, the thermally sprayed ceramic layer 20 does not necessarily have to form a stack structure and may have a single layer structure.

The heater electrode 22 is provided within the thermally sprayed ceramic layer 20, more specifically, between the first film 20a and the second film 20b. The heater electrode 22 exhibits an annular shape coaxial to the intermediate layer 18. The heater electrode 22 is a thermally sprayed heater electrode formed by a thermal spraying method. The heater electrode 22 functions as a heating element to heat the focus ring 5. The heater electrode 22 is a tungsten film formed by spraying tungsten (W) particles to the first film 20a.

Figure 3:
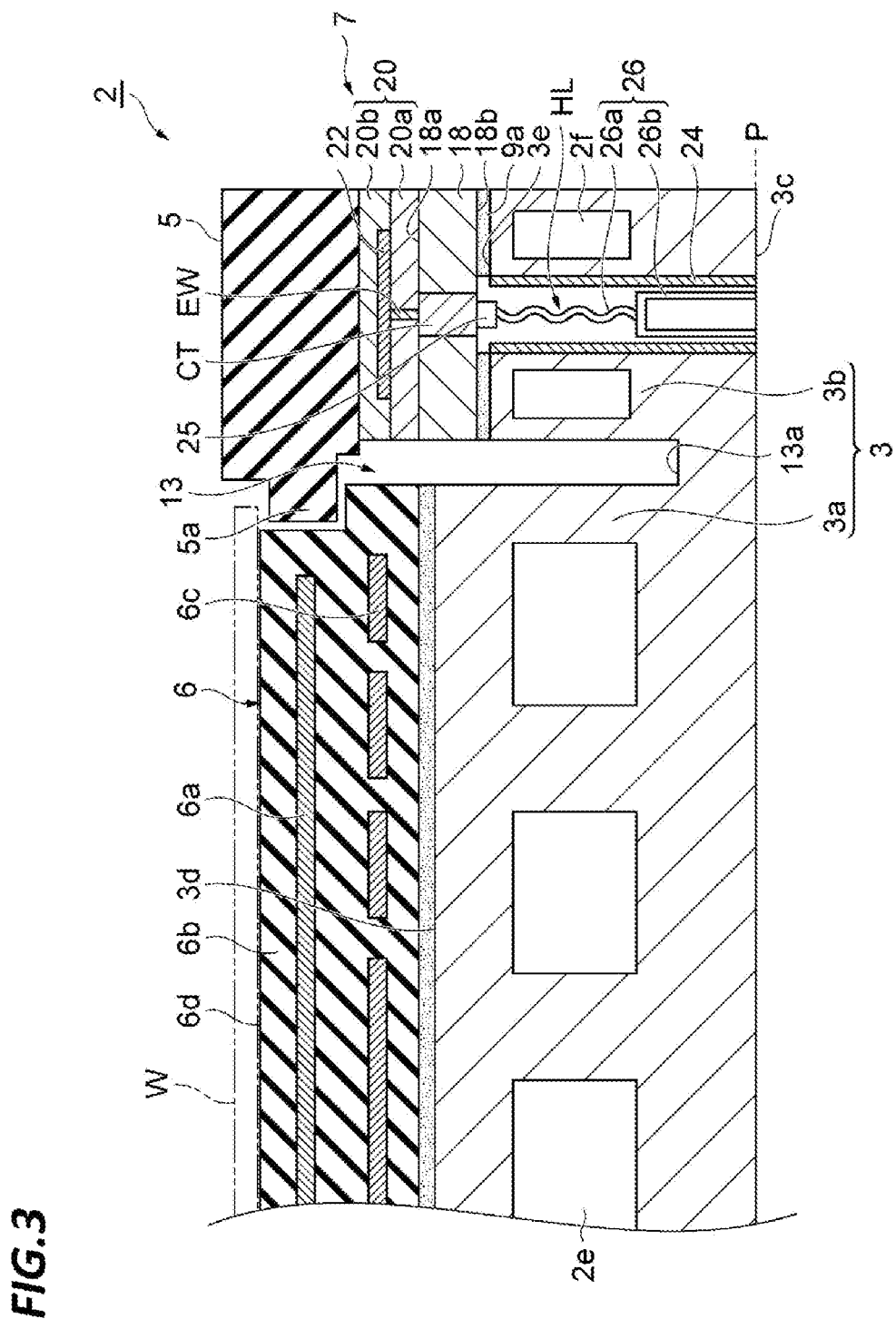
FIG. 3 is an enlarged cross-sectional view illustrating the vicinity of a power feeding mechanism of the placing table according to one exemplary embodiment.

In addition, a power feeding mechanism is provided in the base peripheral edge portion 3b of the base 3 to supply a power generated in the heater power source 14 to the heater electrode 22. The power feeding mechanism will be described below with reference to FIG. 3. FIG. 3 is an enlarged cross-sectional view illustrating the vicinity of the power feeding mechanism of the placing table 2. As illustrated in FIG. 3, the base peripheral edge portion 3b of the base 3 is formed with a through-hole HL that penetrates the base peripheral edge portion 3b from the rear surface 3c to the top surface 3e. The inner wall of the through-hole HL is covered with a cylindrical body 24.

A power feeding contact CT is provided within the intermediate layer 18. The contact CT extends between the top surface 18a and the lower surface 18b of the intermediate layer 18 and one end surface of the contact CT is electrically connected to the heater electrode 22 via an electric wire EW. The other end surface of the contact CT faces the through-hole HL and is electrically connected to a contact element 25. The contact CT is formed of a conductive ceramic material, for example, an alumina ceramic material containing tungsten. When the intermediate layer 18 is formed, the contact CT may be formed by being baked together with the intermediate layer 18.

The contact element 25 is electrically connected to the heater power source 14 via an electric wire 26 (see, e.g., FIG. 1). The electric wire 26 includes a first portion 26a connected to the contact element 25 and a second portion 26b located closer to the heater power source 14 than the first portion 26a. The first portion 26a is a twisted wire formed by twisting and combining a plurality of conductive wires and is formed of a bendable flexible conductive material. The second portion 26b supports the first portion 26a such that the first portion 26a is bent between the contact CT and the second portion 26b. As such, when the first portion 26a is bent, the bent portion is capable of absorbing the deformation of the wire 26 caused by temperature variation during a plasma processing. A power supplied from the heater power source 14 is supplied to the heater electrode 22 through the electric wire 26, the contact element 25, the contact CT, and the electric wire EW. The heater electrode 22 is heated by a calorific value depending on the supplied power. The electric wire EW, the contact CT, the contact element 25, and the electric wire 26 constitute a power feeding mechanism. In addition, at least one power feeding mechanism may be provided in the base peripheral edge portion 3*b*.

Figure 4:
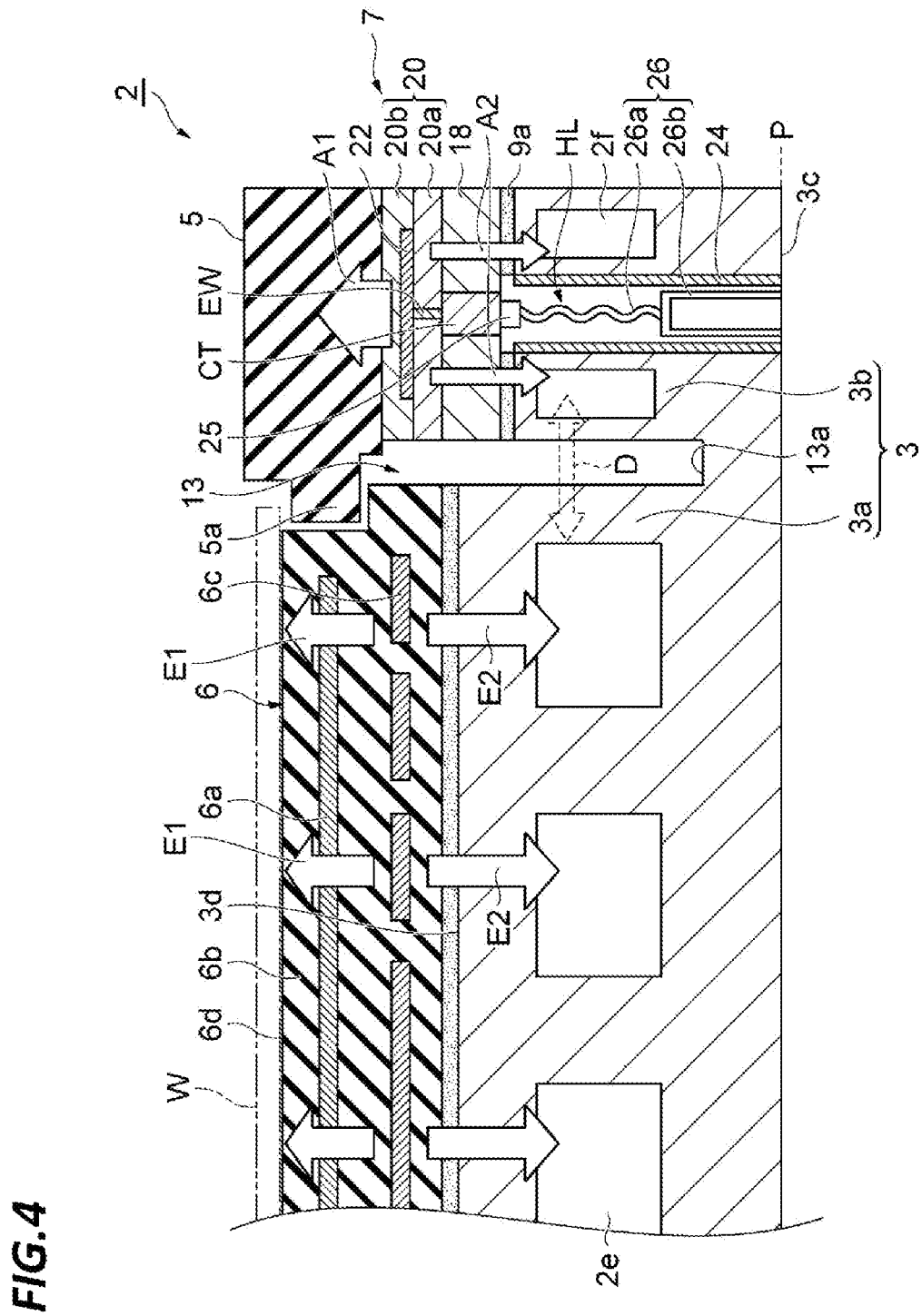
FIG. 4 is a schematic view for describing the acting effects of the placing table according to one exemplary embodiment.

Next, the acting effects of the placing table 2 will be described with reference to FIG. 4. FIG. 4 is a schematic view for describing the acting effects of the placing table 2. As illustrated in FIG. 4, in the placing table 2, the electrostatic chuck 6 is supported by the base central portion 3*a* and the focus ring 5 is supported by the base peripheral edge portion 3*b* via the support member 7. The intermediate layer 18 is interposed between the heater electrode 22 of the support member 7 and the base peripheral edge portion 3*b*. The heat resistance between the heater electrode 22 and the base peripheral edge portion 3*b* increases due to the intermediate layer 18 interposed therebetween, and thus, the temperature gradient between the heater electrode 22 and the base peripheral edge portion 3*b* increases. That is, heat fluxes from the heater electrode 22 to the base peripheral edge portion 3*b* represented by the arrows A2 is reduced. Therefore, the temperature rise of the adhesive 9*a* interposed between the intermediate layer 18 and the base peripheral edge portion 3*b* is suppressed. Thus, the limitation on the heat emission of the heater electrode 22 caused by the heat resistance temperature of the adhesive 9*a* is relieved so that the temperature of the focus ring 5 may be set to be high.

Meanwhile, as the heat resistance between the heater electrode 22 and the base peripheral edge portion 3*b* increases, heat fluxes from the heater electrode 22 to the focus ring 5 represented by the arrow A1 increases. Therefore, the heater electrode 22 may be heated by a low power to raise the temperature of the focus ring 5. That is, the focus ring 5 may be efficiently heated. In this way, in the placing table 2 of one exemplary embodiment, the temperature of the focus ring 5 may be set to be high because, among the heat fluxes generated in the heater electrode 22, it is possible to decrease the heat fluxes directed toward the base peripheral edge portion 3*b* and to increase the heat fluxes directed toward the focus ring 5. Therefore, the placing table 2 is capable of increasing the difference between the set temperature of the wafer W and the set temperature of the focus ring 5.

In particular, in the exemplary embodiment, the heat resistance between the heater electrode 22 and the base peripheral edge portion 3*b* may be further increased because zirconia having a low thermal conductivity is used as a material of the first film 20*a*. As such, the temperature gradient between the heater electrode 22 and the base peripheral edge portion 3*b* may be further increased and, consequently, it is enabled to further increase the difference between the set temperature of the wafer W and the set temperature of the focus ring 5. In addition, both the intermediate layer 18 and the thermally sprayed ceramic layer 20 are formed of a ceramic material and, thus, the difference in thermal expansion therebetween is small. For example, the thermal expansion coefficient of an alumina ceramic sintered compact constituting the intermediate layer 18 is $7.1 \times 10^{-6}/°$ C., and the thermal expansion coefficient of the thermally sprayed zirconia film constituting the first film 20*a* of the thermally sprayed ceramic layer 20 is $10 \times 10^{-6}/°$ C. Accordingly, even if a temperature gradient is generated between the intermediate layer 18 and the thermally sprayed ceramic layer 20, damage to constituent members caused by thermal stress deformation may be prevented.

In addition, in the placing table 2, the top of the base central portion 3*a* and the top of the base peripheral edge portion 3*b* are divided by the groove 13. With the groove 13, the electrostatic chuck 6, and the focus ring 5 are thermally separated from each other. Therefore, the movement of heat in the horizontal direction (the diametric direction of the placing table 2) represented by arrow D is suppressed. Thus, some of the heat generated in the heaters 6*c* of the electrostatic chuck 6 moves toward the placing surface 6*d* of the electrostatic chuck 6 as represented by arrows E1, and the remaining heat moves toward the coolant flow path 2*e* in the base central portion 3*a* as represented by the arrows E2. Likewise, some of the heat generated in the heater electrode 22 of the support member 7 moves toward the focus ring 5 as represented by arrow A1, and the remaining heat moves toward the coolant flow path 2*f* in the base peripheral edge portion 3*b* as represented by arrows A2. That is, the heat generated in the heaters 6*c* of the electrostatic chuck 6 and the heat generated in the heater electrode 22 of the support member 7 move in the vertical direction.

As described above, the movement of heat is suppressed between members that are present above the bottom surface 13*a* of the groove 13. For example, the wafer W, the electrostatic chuck 6, the adhesive 9*b*, and a base portion interposed between the top surface 3*d* of the base central portion 3*a*, and the upper end surface of the inner coolant flow path 2*e* are separated from the focus ring 5, the support member 7, the adhesive 9*a*, and a base portion interposed between the top surface 3*e* of the base peripheral edge portion 3*b* and the upper end surface of the outer coolant flow path 2*f* with a space being interposed therebetween, which suppresses the movement of heat. Therefore, the temperature control of the wafer W and the temperature control of the focus ring 5 may be made to be accurately independent of each other.

In addition, since the base central portion 3*a* and the base peripheral edge portion 3*b* are separated from each other with a space interposed therebetween by the groove 13, the heat generated in the heater electrode 22 may be used for heating the focus ring 5 without being pushed out to the base central portion 3*a*. As a result, the temperature of the focus ring 5 may be set to be further higher since the focus ring 5 may be more efficiently heated.

In addition, since the base central portion 3*a* and the base peripheral edge portion 3*b* are separated from each other with a space interposed therebetween by the groove 13, even if the difference in thermal expansion occurs between the base central portion 3*a* and the electrostatic chuck 6 and between the base central portion 3*a* and the focus ring 5, these constituent members are not damaged by thermal stress deformation. Consequently, it is enabled to increase a difference in stable temperature between the wafer W and the focus ring 5 which is limited by the thermal stress deformation. As such, the groove 13 has a function of absorbing stress deformation as well as an insulation function.

In addition, conventionally, the heater electrode and the power supply terminal are generally connected to each other via a metal junction. In a case where such a configuration is employed, when the difference in temperature between the support member of the focus ring and the metal base increases, a junction may be damaged by deformation caused by temperature variation of each constituent member, causing a junction defect. Whereas, in the exemplary embodiment described above, the contact CT connected to the heater electrode 22 is provided in the intermediate layer 18. Since the contact CT is formed of a conductive ceramic material, the difference between the thermal expansion of the contact CT and the thermal expansion of the intermediate layer 18 and the thermally sprayed ceramic layer 20 is very small. Thus, even if deformation such as expansion or contraction of the components of the support member 7 occurs due to temperature variation, thermal stress is hardly generated. Thus, occurrence of a junction defect can be suppressed.

Although various exemplary embodiments have been described above, the present disclosure is not limited to the above-described exemplary embodiments and various other alternative embodiments may be obtained. For example, although the above-described plasma processing apparatus 10 is a capacitively coupled plasma processing apparatus, the placing table 2 may be adopted in any of other plasma processing apparatuses. For example, the plasma processing apparatus may be any type of plasma processing apparatus such as an inductively coupled plasma processing apparatus, or a plasma processing apparatus that excites gas via surface waves such as microwaves.

In addition, in the above-described embodiment, although the base central portion 3a and the base peripheral edge portion 3b are divided by the groove 13, the base central portion 3a and the base peripheral edge portion 3b do not have to be necessarily divided. For example, the base central portion 3a and the base peripheral edge portion 3b may be physically successive and the base peripheral edge portion 3b may support the focus ring 5 via the support member 7. Even in this case, the temperature gradient between the heater electrode 22 and the base peripheral edge portion 3b may be increased by the intermediate layer 18 interposed between the heater electrode 22 and the base peripheral edge portion 3b. As a result, the limitation on the calorific value of the heater electrode 22 caused by the heat resistance temperature of the adhesive 9a is relieved. Thus, the temperature of the focus ring 5 may be set to be high.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A placing table configured to place a workpiece thereon, the placing table comprising:
   an electrostatic chuck configured to attract the workpiece;
   a support member configured to support a focus ring; and
   a metal base having a first region configured to support the electrostatic chuck and a second region configured to support the support member, the second region surrounding the first region,
   wherein the support member includes:
   an intermediate layer formed of a ceramic sintered compact and supported on the second region via an adhesive;
   a thermally sprayed ceramic layer formed on the intermediate layer by a thermal spraying method; and
   a heater electrode provided within the thermally sprayed ceramic layer, the heater electrode being formed by the thermal spraying method,
   wherein the thermally sprayed ceramic layer includes a first film above the intermediate layer and extending below the heater electrode, and a second film above the first film, the second film extending above the heater electrode,
   the placing table further comprising:
   a power feeding contact formed of a conductive ceramic material extending through the intermediate layer, the power feeding contact electrically connected to the heater electrode;
   a heater power supply;
   an electrical contact connected to a bottom of the power feeding contact; and
   a first wiring connected to the electrical contact, the first wiring providing power from the heater power supply to the electrical contact.

2. The placing table according to claim 1, wherein the thermally sprayed ceramic layer includes a zirconia film formed as the first film between the heater electrode and the intermediate layer by the thermal spraying method.

3. A plasma processing apparatus comprising the placing table defined in claim 1.

4. The placing table according to claim 1, wherein the first film has a thickness in a range from 0.05 mm to 3.0 mm, the second film has a thickness in a range from 0.05 mm to 3.0 mm, and a material of the first and second films has a thermal conductivity lower than a thermal conductivity of a material of the intermediate layer.

5. The placing table according to claim 1, wherein the power feeding contact extends from a bottom of the intermediate layer to a top of the intermediate layer and is baked with the ceramic sintered compact of the intermediate layer.

6. The placing table according to claim 5, wherein:
   a material of the thermally sprayed ceramic layer has a thermal conductivity lower than a thermal conductivity of a material of the intermediate layer,
   the adhesive has a heat resistance in a range of 0.1 W/mK to 0.5 W/mK, and
   the adhesive has a thickness in a range of 0.07 mm to 1.8 mm.

7. The placing table according to claim 6, further including a second wiring extending between the power feeding contact and the heater electrode, the second wiring extending through the first film, and
   wherein the adhesive is between the second region of the metal base and the intermediate layer at a location which surrounds the electrical contact.

8. A placing table configured to place a workpiece thereon, the placing table comprising:
   an electrostatic chuck configured to attract the workpiece;
   a support member configured to support a focus ring; and
   a metal base having a first region configured to support the electrostatic chuck and a second region configured to support the support member, the second region surrounding the first region,
   wherein the support member includes:
   an intermediate layer formed of a ceramic sintered compact and supported on the second region via an adhesive;
   a thermally sprayed ceramic layer formed on the intermediate layer by a thermal spraying method;
   a heater electrode provided within the thermally sprayed ceramic layer, the heater electrode being formed by the thermal spraying method; and a power feeding contact formed of a conductive ceramic material extending through the intermediate layer, the power feeding contact electrically connected to the heater electrode;
a heater power supply;
an electrical contact connected to a bottom of the power feeding contact; and
a first wiring connected to the electrical contact, the first wiring providing power from the heater power supply to the electrical contact.

9. The placing table of claim 8, wherein the first wiring is at least one of bent or twisted.

10. The placing table of claim 9, further including a second wiring extending between the power feeding contact and the heater electrode.

11. The placing table according to claim 10, wherein the second wiring extends through a portion of the thermally sprayed ceramic layer at a location below the heater electrode.

12. The placing table according to claim 11, wherein the power feeding contact extends from a bottom of the intermediate layer to a top of the intermediate layer and is baked with the ceramic sintered compact of the intermediate layer.

13. The placing table according to claim 12, wherein the adhesive has a heat resistance in a range of 0.1 W/mK to 0.5 W/mK.

14. The placing table according to claim 13, wherein the adhesive has a thickness in a range of from 0.07 mm to 1.8 mm.

15. The placing table according to claim 8, wherein the power feeding contact extends from a bottom of the intermediate layer to a top of the intermediate layer and is baked with the ceramic sintered compact of the intermediate layer.

16. A placing table configured to place a workpiece thereon, the placing table comprising:
an electrostatic chuck configured to attract the workpiece;
a support member configured to support a focus ring; and
a metal base having a first region configured to support the electrostatic chuck and a second region configured to support the support member, the second region surrounding the first region,
wherein the support member includes:
an intermediate layer formed of a ceramic sintered compact and supported on the second region;
a thermally sprayed ceramic layer formed on the intermediate layer by a thermal spraying method;
a heater electrode provided within the thermally sprayed ceramic layer, the heater electrode being formed by the thermal spraying method; and
wherein a material of the thermally sprayed ceramic layer has a thermal conductivity lower than a thermal conductivity of a material of the intermediate layer formed of the ceramic sintered compact,
the placing table further comprising:
a power feeding contact formed of a conductive ceramic material extending through the intermediate layer, the power feeding contact electrically connected to the heater electrode;
a heater power supply;
an electrical contact connected to a bottom of the power feeding contact; and
a first wiring connected to the electrical contact, the first wiring providing power from the heater power supply to the electrical contact.

17. The placing table according to claim 16, wherein the thermally sprayed ceramic layer includes a first film which extends below the heater electrode and a second film which extends above the heater electrode, and the material having the thermal conductivity lower than the material of the intermediate layer of the ceramic sintered compact is present in at least one of the first and second films.

18. The placing table according to claim 17, further including an adhesive attaching the intermediate layer to the second region, the adhesive having:
a thermal conductivity in a range of 0.1 W/mK to 0.5 W/mK; and
a thickness in a range of 0.07 mm to 1.8 mm.

* * * * *